United States Patent [19]

Schweitzer

[11] 4,196,393
[45] Apr. 1, 1980

[54] MICROWAVE SIGNAL DETECTOR

[75] Inventor: Harold P. Schweitzer, Fort Erie, Canada

[73] Assignee: Glar Ban Company, North Tonawanda, N.Y.

[21] Appl. No.: 846,327

[22] Filed: Oct. 28, 1977

[51] Int. Cl.² ............................................. H04B 1/00
[52] U.S. Cl. ........................... 340/600; 329/205 TD; 343/18 D; 455/337
[58] Field of Search ............... 325/364, 365, 373, 370, 325/340, 341, 31, 442, 455, 466, 363; 343/5 R, 6.8 R, 18 R, 18 D, 18 E, 17.7, 772, 773, 850, 894; 329/204, 205 TD, 161; 324/77 B

[56] References Cited

U.S. PATENT DOCUMENTS

| | | | |
|---|---|---|---|
| 2,832,885 | 4/1958 | Brett | 325/373 |
| 3,094,663 | 6/1963 | Siegel | 325/364 |
| 3,465,253 | 9/1969 | Rittenbach | 325/341 |

*Primary Examiner*—Robert L. Griffin
*Assistant Examiner*—Tommy P. Chin
*Attorney, Agent, or Firm*—LeBlanc, Nolan, Shur & Nies

[57] ABSTRACT

Disclosed is a microwave detector for giving an indication of the presence of microwave energy at either X-band or K-band frequencies. It utilizes a common horn and waveguide resonator with four diodes. A divider separates the waveguides into two compartments and the pairs of modulator and detector diodes are in respective compartments. The diode pairs extend at right angles to each other across the short dimension of the respective compartments and the horn and antenna are oriented so that the diode pairs both extend substantially at a 45° angle to the vertical.

19 Claims, 12 Drawing Figures

FIG. 8
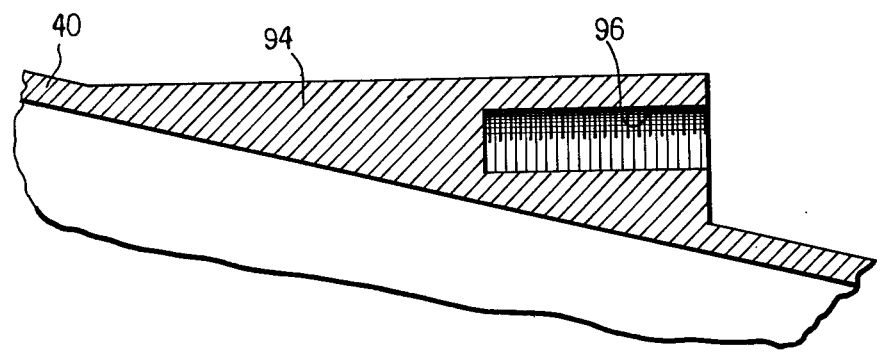
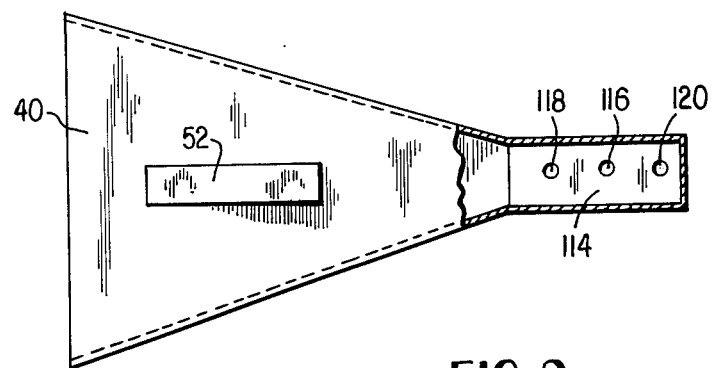
FIG. 9
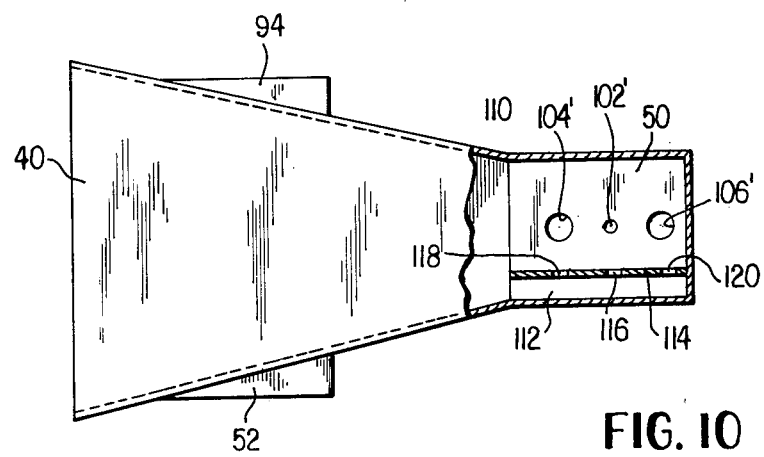
FIG. 10

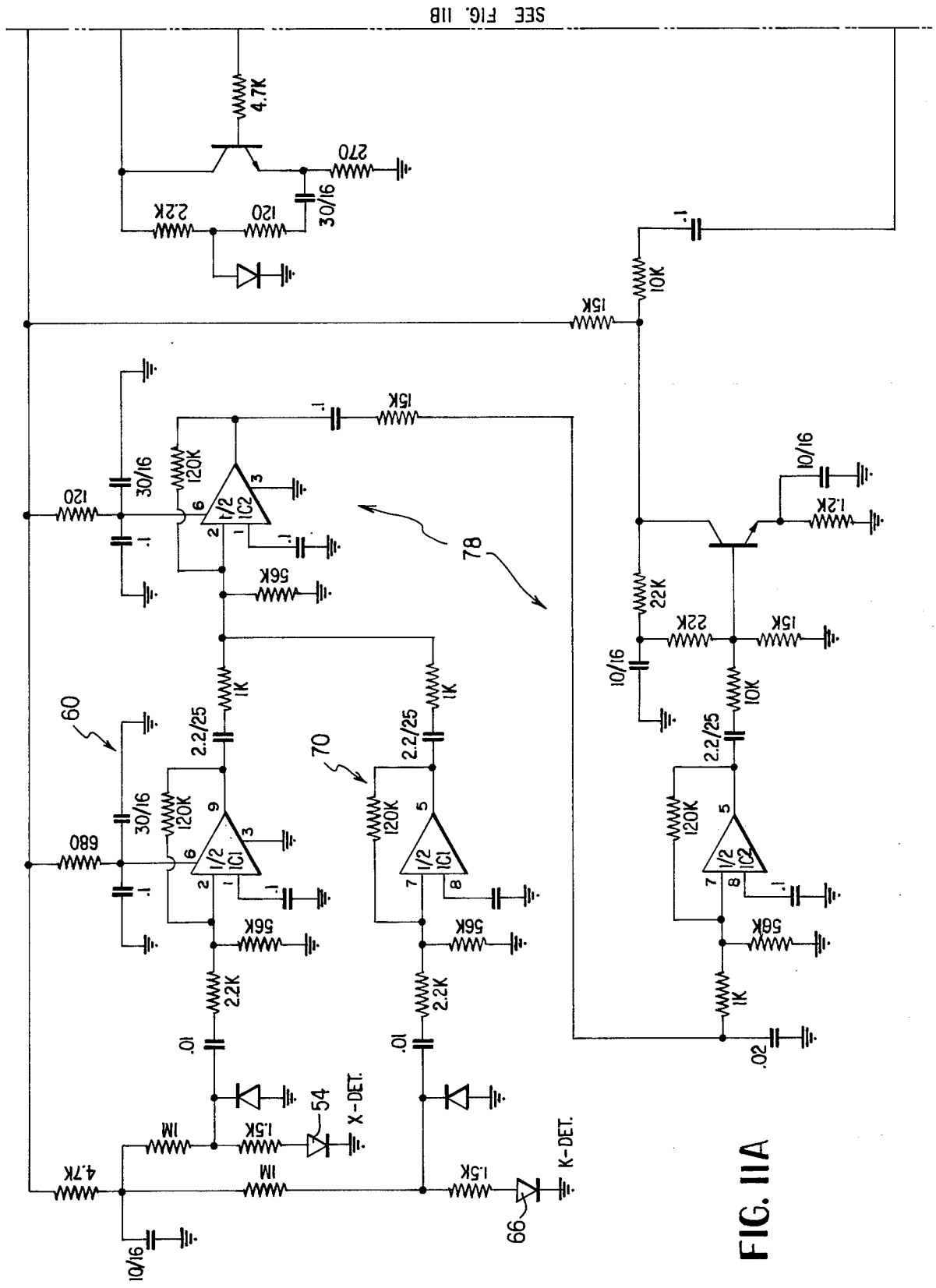

MICROWAVE SIGNAL DETECTOR

MICROWAVE SIGNAL DETECTOR

This invention relates to a small portable microwave signal detector for detecting continuous wave radiations. It is particularly adapted for use in an automobile as a device usable by the motorist or vehicle driver to detect police radar.

There is disclosed in assignee's U.S. Pat. No. 3,094,663 issued June 18, 1963, a microwave signal detector particularly adapted for use in detecting police S and X-band radar. While devices of this general type have been banned in a few jurisdictions as contrary to public policy in detecting police radar, they have been accepted in the vast majority of the states as having a desirable and salutary effect. The devices have been found much in the manner of roadside warning signs to make the motorist more speed conscious, and it is believed, more overall conservative in his driving habits. A number of such devices are presently on the market and sold under various brand names. They have been received with enthusiasm by a continuously growing segment of the population and the law enforcement community.

While primarily constructed for use as a police radar detector, the device of the present invention is useful for a large variety of other purposes, such as a driver alarm to warn motorists of various traffic or road conditions, for the detection of dangerous high energy radiation leakage from radar installations, and for military usage in the detection of enemy surveillance radar.

Police radar is a continuous wave radiation and presently operates primarily at X and K-band frequencies. For this reason, it is desirable to provide a relatively simplified and inexpensive unit which will detect continuous wave microwave radiation in both of these frequency bands. The present invention is directed to such a two-band device and, particularly, one which incorporates a simplified microwave horn and waveguide resonance cavity, so that the same horn and same cavity, in fact, are usable over both frequency bands. This is accomplished by connecting to the microwave horn, a length of waveguide suitably dimensioned to provide a resonator at the lower X-band frequencies and suitably locating in this waveguide, detector and modulator diodes, much in the matter illustrated in FIGS. 13 and 14 of Assignee's U.S. Pat. No. 3,094,663. However, extending lengthwise of the microwave cavity or resonator adjacent the two larger X-band diodes is an electrically conductive divider, which in effect, forms a smaller waveguide resonator in conjunction with a portion of the larger waveguide. Extending across this smaller waveguide at right angles to the two larger diodes, are a pair of smaller K-band diodes forming oscillator and detector diodes for the K-band waveguide or cavity resonator.

With the two waveguides at right angles to each other and utilizing a common horn, the entire assembly is supported in a housing at a forty-five degree angle so that the horn and each of the resonant cavities is tilted at an angle of at least approximately forty-five degrees to the vertical when suitably mounted on the dashboard of an automobile. In this way, sufficient radiation is picked up at either or both frequencies irrespective of polarization of the incoming microwave energy, such that when continuous wave energy is picked up by the horn and appears in the waveguide, it both sounds a buzzer and lights a light to give both a visible and audible warning to the driver that he is coming under the surveillance of police radar or is in another continuous wave X or K-band microwave energy field.

It is therefore, one object of the present invention to provide an improved microwave signal detector.

Another object of the present invention is to provide a two band detector for continuous wave radar frequency energy.

Another object of the present invention is to provide an improved two band microwave detector, particularly adapted for use by motorists in detecting police radar.

Another object of the present invention is to provide a two band microwave signal detector which utilizes a common radar horn.

Another object of the present invention is to provide a dual band radar detector having a common horn connected to a microwave cavity with a conductive divider.

Another object of the present invention is to provide a dual band microwave detector with two sets of detector and oscillator diodes at right angles to each other.

Another object of the present invention is to provide a two band microwave detector utilizing a common radar horn having its four terminal corners lying in at least substantially mutually perpendicular, horizontal and vertical planes.

These and further objects and advantages of the invention will be more apparent upon reference to the following specification, claims and appended drawings wherein:

FIG. 8 is an enlarged cross section through the correspondingly circled detail in FIG. 7 showing one of the attachment bosses and apertures for attaching the horn to the case of the detector.

FIG. 9 is a side view of the horn and waveguide cavity showing the positioning of the smaller K-band diodes.

FIG. 10 is a plan view of the horn and cavity, with a portion of the cavity broken away to show the position of the conductive divider or separating diaphram and, FIGS. 11A and 11B taken together form a detailed circuit diagram of the microwave detector of this invention.

Figure 1:
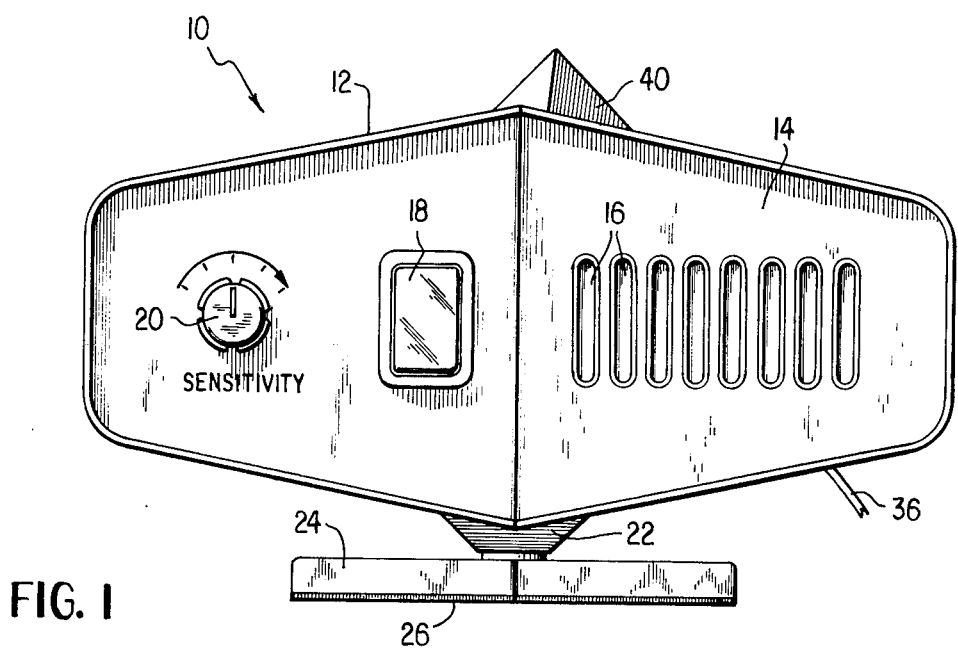
FIG. 1 is a front view of a microwave detector constructed in accordance with this invention.
Figure 2:
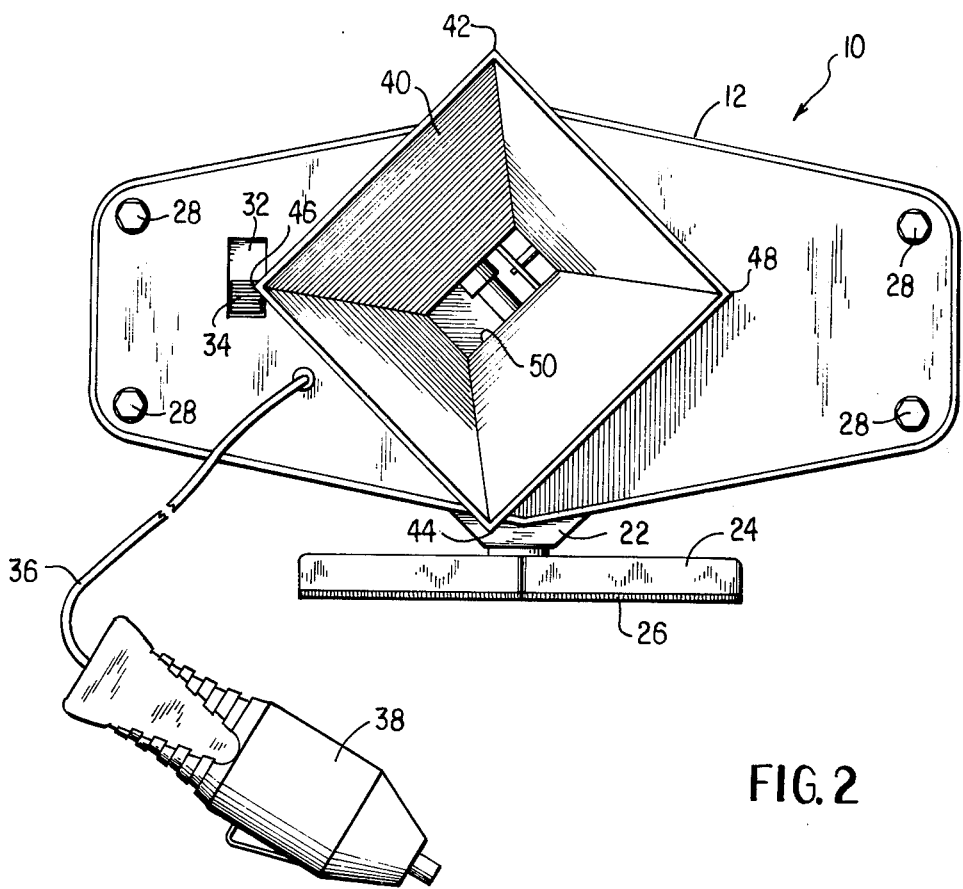
FIG. 2 is a rear view of the detector showing that portion which is directed forward of the vehicle.
Figure 3:
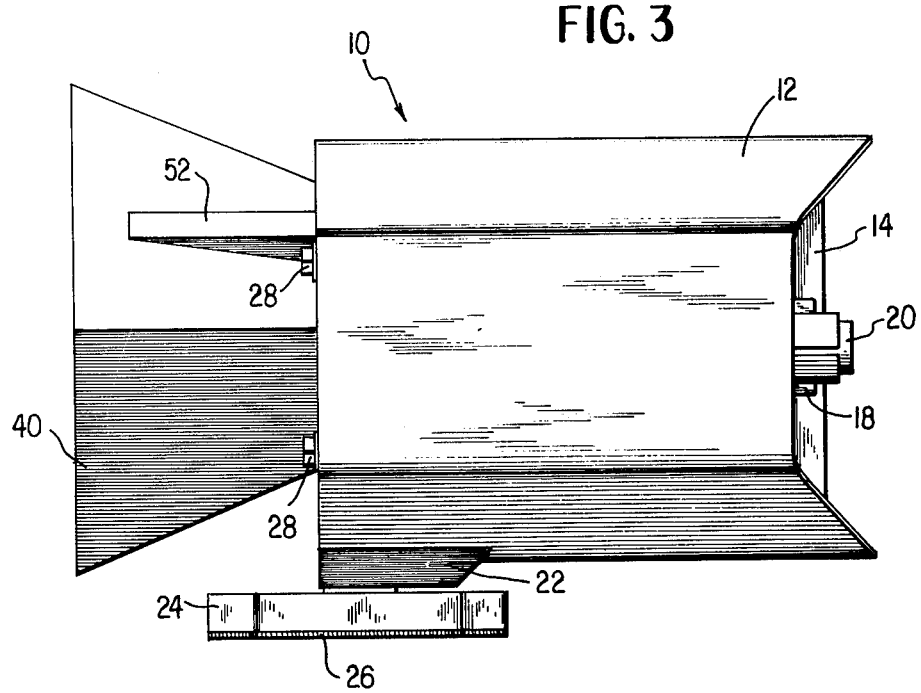
FIG. 3 is a side view of an overall microwave detector.

Referring to the drawings, the novel microwave detector of the present invention is generally indicated at 10 in FIGS. 1, 2 and 3. It comprises a housing 12 which houses the electronics and which supports a front plate 14 having a series of eight elongated apertures 16 through which a buzzer inside the housing emits sound when microwave energy is detected. Also, on the front face 14 is a rectangularly shaped light 18 which is illuminated at the same time the buzzer sounds through the apertures 16. The face plate 14, also supports a rotatable knob 20 which may be rotated in either a clockwise or counterclockwise direction to adjust the sensitivity of the unit. Depending from housing 12 is a pedestal 22 terminating in a stand 24 preferably having a velcro pad 26 adhesively secured to its underside and adapted to engage a cooperating pad mounted on the dashboard of an automobile.

Referring to FIG. 2, secured to the rear of the housing by suitable screws, such as those illustrated at 28, is a rear plate 30. This plate is apertured as at 32 and through the aperture passes the operating handle 34 of an on/off slide switch 34. Power is supplied to the unit by way of a cable 36 and a conventional plug 38 adapted to be received in the standard cigarette lighter receptacle of an automobile or truck. The unit receives a 12 volt DC supply by way of cable 36 and plug 38.

Referring to FIGS. 2 and 3, projecting through the rear plate 30 is a microwave horn 40 having a square shape at its wider outer end but positioned so that two of the corners 42 and 44 lie substantially in a vertical plane and the other two corners of the square indicated at 46 and 48 lie at least substantially in a horizontal plane when the unit is mounted on the dashboard of a car. The horn tapers inwardly and terminates in a microwave cavity or waveguide resonator section 50, in which are mounted four diodes as more fully described below. A pair of bosses, one of which is illustrated at 52 in FIG. 3, are formed on the horn for the purposes of attaching it to the housing as more fully described below. The horn 40 and integral waveguide cavity 50 are preferably cast as a single electrically conductive metal piece.

Figure 4:
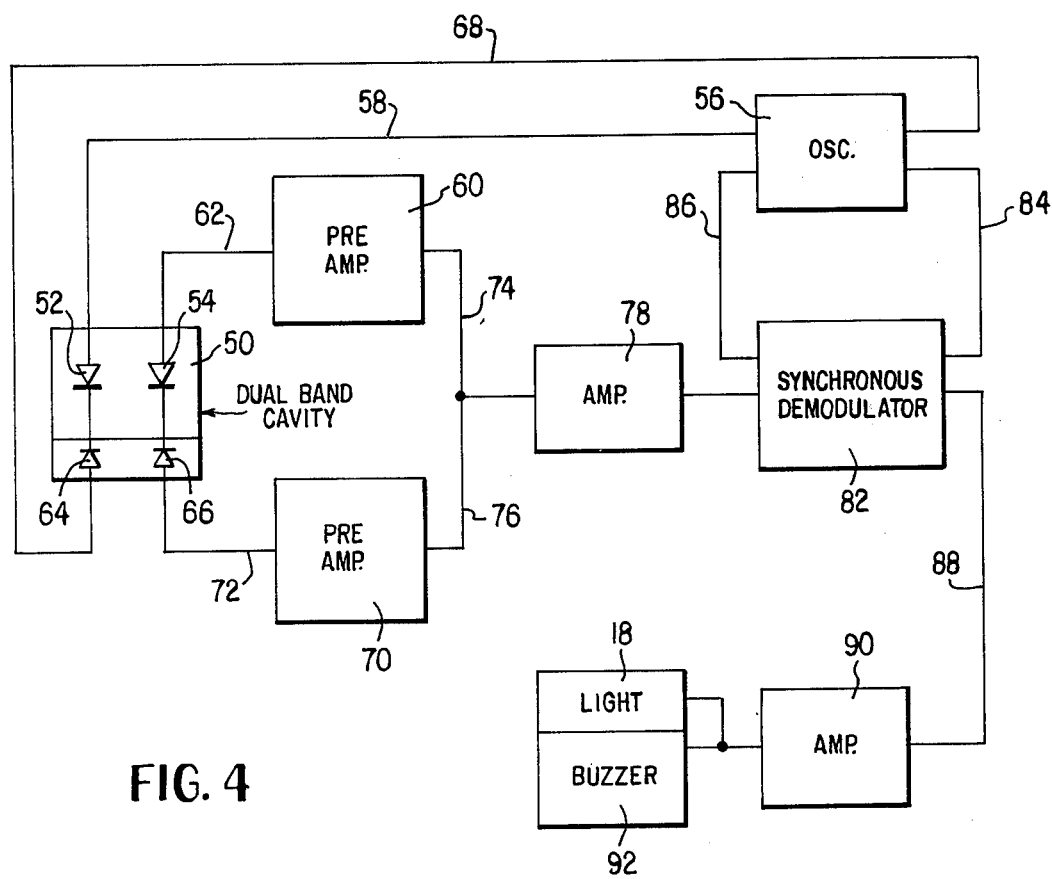
FIG. 4 is a simplified block diagram of the circuitry for the two band detector of this invention.

FIG. 4 is a simplified block diagram of the electrical circuit for the dual band detector of this invention. The waveguide resonator is shown at 50 in FIG. 4 as containing a pair of X-band diodes 52 and 54, the former connected to an oscillator 56 by way of a lead 58, and the latter to a preamplifier 60 by way of a lead 62. Separated from the X-band diodes by an electrically conductive divider are a pair of K-band diodes 64 and 66, the former connected to oscillator 56 by way of a lead 68 and the latter to a preamplifier 70 by way of a lead 72. The outputs of both preamplifiers 60 and 70 feed by way of respective leads 74 and 76 to the input of a common amplifier 78, having its output connected by a lead 80 to a synchronous detector or demodulator 82. The demodulator 82 is synchronized with oscillator 56 by way of leads 84 and 86. The audio output from demodulator 82 is fed by way of a lead 88 to an audio frequency amplifier 90, which in turn, drives a buzzer 92 audible through the apertures 16 of FIG. 1 and which also drives the light 18 of FIG. 1.

Figure 5:
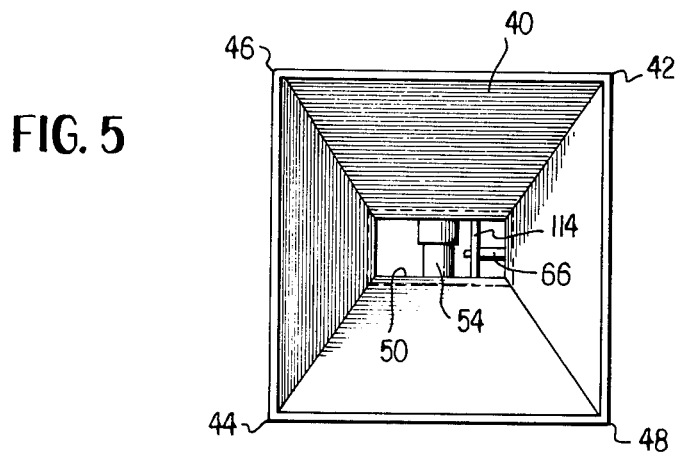
FIG. 5 is a front view of the radar horn.
Figure 6:
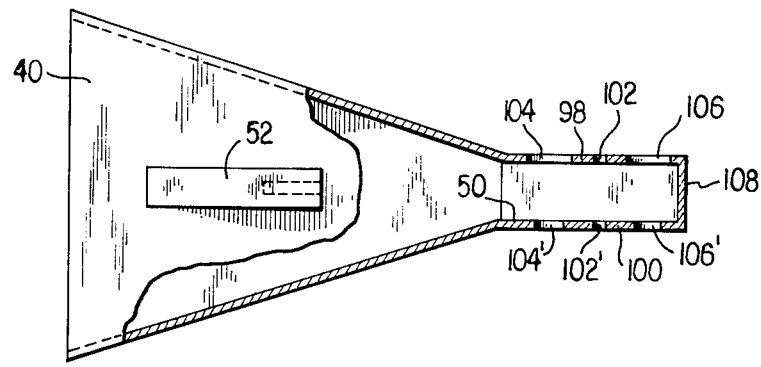
FIG. 6 is a side view of the radar horn and waveguide resonator showing the positioning of the larger X-band diodes.
Figure 7:
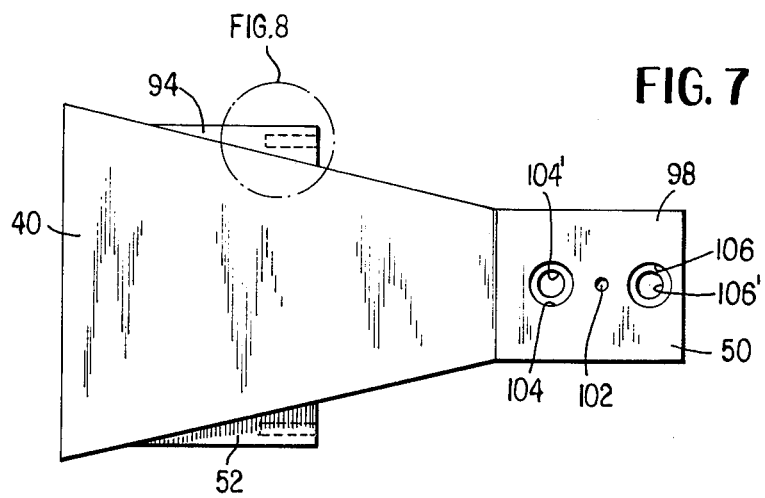
FIG. 7 is a plan view of the horn and resonator of FIG. 6.

FIGS. 5 and 6 are front end and side views respectively of the microwave horn 40 and integral waveguide resonator or microwave cavity 50. FIG. 7 is a top plan view and FIG. 8 is an enlargement in cross-section of the circled detail in FIG. 7. Formed on the sides of the horn, diametrically opposite each other, are the bosses 52 and 94, which not only act as stops to position the front of the horn up against the back face 30 of the microwave detector, but are apertured and internally threaded as indicated at 96 in FIG. 8, so that the horn is securely attached to the back plate of the housing. The cavity resonator has three holes in both its top wall 98 and its bottom wall 100, the central aperture in the top wall being illustrated at 102 in FIG. 7. The central apertures 102 and 102' are used to attached the cavity resonator to suitable support structure inside the housing. A pair of forward apertures adjacent the horn, again indicated at 104 and 104', are for supporting the ends of a detector diode adapted to extend across the center of the waveguide cavity and rear apertures 106 and 106' are for supporting a corresponding modulator diode. The upper holes, by way of example only, may have a diameter of 0.312 inch while the lower holes 104' and 106' may have a diameter of 0.096 inch. The waveguide cavity is typically one inch wide (outer dimension) and one-half inch high (outer dimension) with a wall thickness of 0.050 inch. The holes 104 and 106 (and corresponding holes 104' and 106') are spaced on center lines 0.0700 inches apart and the center line of the two rear apertures 106 and 106' is 0.206 inch from the outer surface of back wall 108 of the cavity.

FIGS. 9 and 10 are side and plan views respectively with the waveguide in cross-section to particularly show the apertures for and placement of, the smaller K-band diodes. The waveguide cavity 50 is, in fact, divided into two separate compartments or waveguide cavities, 110 and 112 by a divider 114. This divider has a central aperture 116 permitting access between the two compartments or cavities, a forward aperture 118 adjacent the horn for supporting one end of a K-band detector diode and a rear aperture 120 for supporting the end of a K-band modulator diode 120. The spacing and positioning of the diodes is illustrated in FIG. 9. They are set up for a frequency of 24.15 gigahertz which has a wavelength in the waveguide of 0.6015 inches. The spacing of 0.77 inch between the two diodes is approximately equal to one and one quarter wavelength at this frequency and the spacing of 0.167 of the rear diode from the outer back wall of the cavity is approximately a quarter wavelength, of course, modified by the reflection due to the back wall of the waveguide. The exact positioning and locating of the diodes for a particular center frequency is normally determined empirically because of the impedance effect the diodes themselves have on the standing waves within the waveguide resonator. Once determined, this positioning and spacing can be maintained since variations between horn and waveguide castings and the diodes themselves is insufficient to have a substantial effect on the operating characteristics of the system.

Figure 11B:
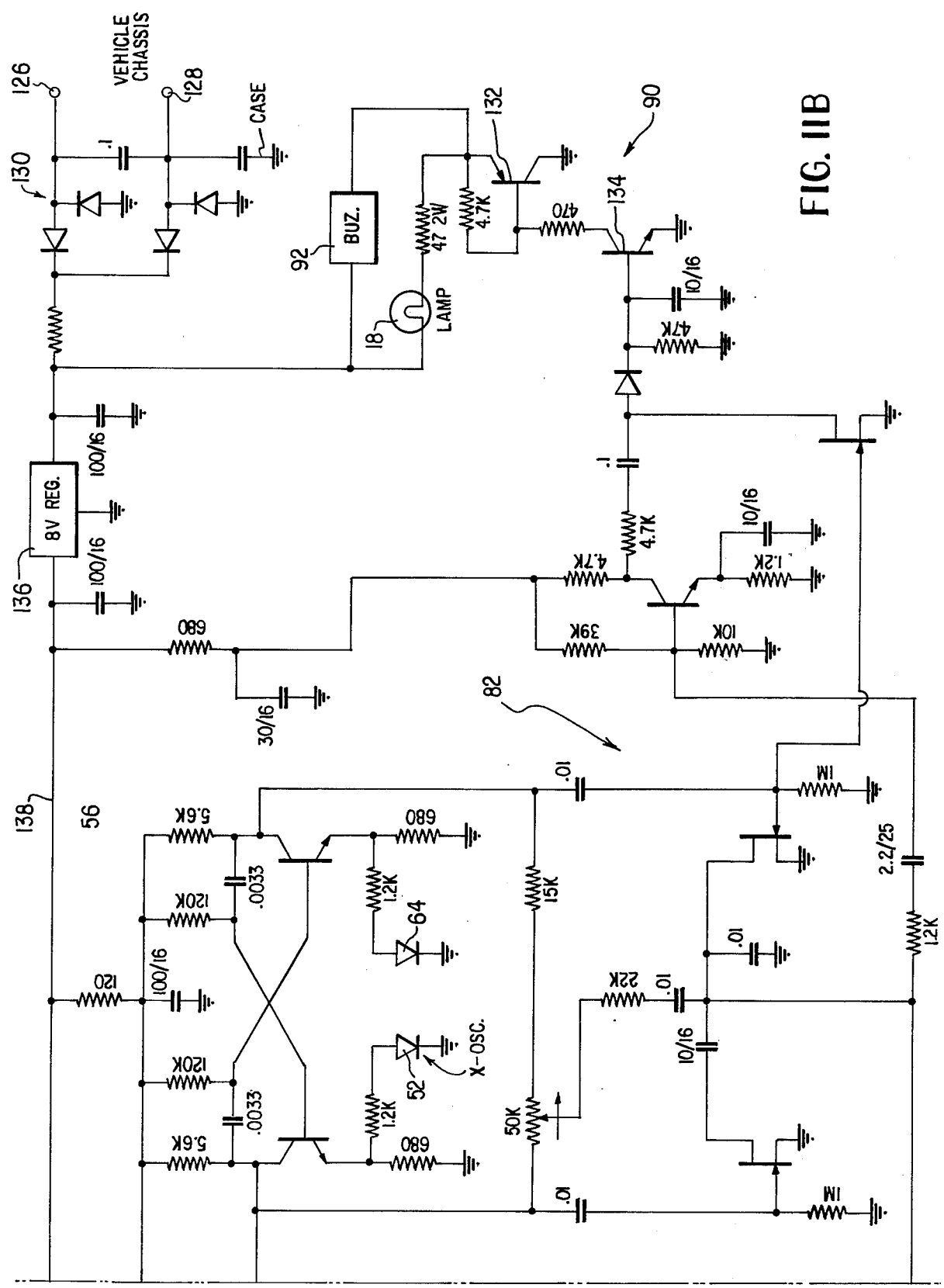

FIGS. 11A and 11B taken together show a detailed circuit diagram of the microwave detector 10 of the present invention in which like parts bear like reference numerals. Plug 38 of FIG. 2 is adapted to be inserted into the cigarette lighter receptacle of the automotive vehicle and supplies 12 volts DC to the power supply terminals 126 and 128 of FIG. 11. The power is supplied through a filter generally indicated at 130 and acts to drive the lamp 18 and the buzzer 92 by way of a pair of junction transistors 132 and 134. A voltage regulator 136 produces an eight volt regulated voltage at its output 138 and this supplies power to the preamplifiers 60 and 70, the amplifier 78, the oscillator 56 and the synchronous detector 82. The integrated circuits forming the amplifier and preamplifier indicated IC-1 and IC-2, by way of example only, may be a National Semi-conductor type LM 387. The detector diodes 54 and 56 are illustrated as connected to the inputs of the preamplifiers 60 and 70 whereas the oscillator diodes 52 and 64 form part of the modulating oscillator 56.

It is apparent from the above that the present invention provides an improved microwave detector and particularly a simplified two band detector utilizing a common horn and waveguide cavity cast as a single part. Important features of the present invention include the provision of a divider in the waveguide cavity, which in fact forms two compartments or resonators, one for the lower and more standard X-band and the other for the higher K-band police radar. When microwave energy is present, it is collected by the horn and forms standing waves in the waveguides in a well known manner. The energy at the detector is modulated at the frequency of the oscillator by periodic energization of the modulator diodes which change impedance and, therefore, the standing wave energy at the detectors. This low frequency energy at the frequency of the oscillator is detected, amplified and then synchronously demodulated to produce an audio output which is amplified and then applied to visible and audio indicators such as the indicator light 18 and the buzzer 92. Energy at either or both X and K-band frequencies acts to operate the indicators. While described in conjunction with its use as a police radar detector, the device of the present invention has wide applicability for use in detecting radar warning signals or continuous wave radar energy wherever it may exist.

While a specific embodiment of the invention has been shown and described in detail, it will be understood that the invention may be modified without departing from the spirit of the inventive principles as set forth in the hereafter appended claims.

What is claimed is:

1. A microwave signal detector for receiving two frequency bands comprising a common microwave antenna, a waveguide cavity resonator coupled to said antenna, said waveguide cavity resonator having an electrically conductive divider which divides it lengthwise into two compartments, a first pair of lower frequency diodes in said waveguide resonator, a second pair of higher frequency diodes in said waveguide resonator, said first pair of diodes being in a first of said compartments and said second pair of diodes being in the second of said compartments, an oscillator circuit coupled to one of each pair of diodes, a detector circuit coupled to the other of each pair of diodes, and an alarm coupled to the output of said detector circuit.

2. A signal detector according to claim 1 wherein said common microwave antenna comprises a waveguide horn.

3. A signal detector according to claim 2 wherein said horn and waveguide resonator are formed as an integral casting.

4. A signal detector according to claim 1 wherein said diode pairs each comprise a modulator diode and a detector diode.

5. A signal detector according to claim 4 wherein said lower frequency diodes are X-band diodes and said higher frequency diodes are K-band diodes.

6. A signal detector according to claim 1 wherein said first diodes and first compartment are larger than said second diodes and said second compartment.

7. A signal detector according to claim 1 wherein said compartments are of rectangular cross section, said diodes spanning the shorter dimension of the respective compartments.

8. A signal detector according to claim 7 wherein said diodes in said first compartment are oriented at least approximately 90° with respect to the orientation of the diodes in said second compartment.

9. A microwave signal detector comprising a housing having a front plate and a back plate, control and alarm means on said front plate, a microwave horn mounted on said back plate, a waveguide cavity resonator coupled to said horn, said waveguide resonator including a larger rectangular cross section compartment communicating with said horn and a smaller rectangular cross section compartment also communicating with said horn, a first pair of diodes comprising a modulator diode and a detector diode extending across the shorter dimension of said larger compartment, a second pair of diodes commprising a modulator diode and a detector diode extending across the shorter dimension of said smaller compartment, an oscillator circuit coupled to both said modulator diodes, and a detector circuit coupling both said detector diodes to said alarm means.

10. A signal detector according to claim 9 wherein said alarm means is visible.

11. A signal detector according to claim 9 wherein said alarm means comprises an audible alarm.

12. A signal detector according to claim 9 wherein said first pair of diodes have centerlines lying in a plane which is perpendicular to a plane containing the centerlines of said second pair of diodes.

13. A signal detector according to claim 12 wherein said housing has a stand, said centerline planes forming an angle of at least approximately 45° with a vertical plane when said housing is in an upright position on said stand.

14. A signal detector according to claim 13 wherein said horn flares to a square open end having its respective corners aligned in horizontal and vertical planes to define a diamond shaped opening at its larger end.

15. A signal detector according to claim 13 wherein said diodes are aligned longitudinally of said waveguide resonator in their respective compartments, said diodes being spaced by an integral number of a quarter wavelength at the operating frequency of said compartment.

16. A signal detector according to claim 15 wherein said larger compartment is dimensioned to operate at X-band frequencies and said smaller compartment is dimensioned to operate at K-band frequencies.

17. A signal detector according to claim 16 wherein said detector circuit comprises a synchronous demodulator coupled to said oscillator circuit.

18. A signal detector according to claim 17 including a power cord coupled to said circuits and diodes, said cord having a plug at its end adapted to be received in the cigarette lighter receptacle of an automotive vehicle.

19. A signal detector according to claim 18 wherein said alarm means comprises both a light and a buzzer.

* * * * *